US012681383B2

(12) United States Patent
Huang et al.

(10) Patent No.: US 12,681,383 B2
(45) Date of Patent: Jul. 14, 2026

(54) LITHOGRAPHY FOCUS CONTROL METHOD

(71) Applicant: Taiwan Semiconductor Manufacturing Company, Ltd., Hsinchu (TW)

(72) Inventors: I-Hsiung Huang, Hsinchu (TW); Yung-Cheng Chen, Jhubei (TW); Tzung-Hua Lin, Taipei (TW); Feng-Yuan Chang, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1123 days.

(21) Appl. No.: 17/667,012

(22) Filed: Feb. 8, 2022

(65) Prior Publication Data

US 2023/0008957 A1 Jan. 12, 2023

Related U.S. Application Data

(60) Provisional application No. 63/220,072, filed on Jul. 9, 2021.

(51) Int. Cl.
*G03F 1/84* (2012.01)
*G03F 7/20* (2006.01)
*H10W 46/00* (2026.01)

(52) U.S. Cl.
CPC .............. *G03F 1/84* (2013.01); *G03F 7/2004* (2013.01); *H10W 46/00* (2026.01); *H10W 46/301* (2026.01)

(58) Field of Classification Search
CPC ............. G03F 1/84; G03F 1/82; G03F 7/2004
See application file for complete search history.

(56) References Cited

U.S. PATENT DOCUMENTS

| | | | |
|---|---|---|---|
| 2003/0211700 A1* | 11/2003 | Leung ................. | G03F 7/70683 430/30 |
| 2007/0154824 A1* | 7/2007 | Sentoku .............. | G03F 7/70641 430/30 |
| 2008/0020292 A1* | 1/2008 | Gardiner ............. | G03F 7/70941 430/30 |
| 2024/0054669 A1* | 2/2024 | Houben ................... | G06T 7/13 |

* cited by examiner

*Primary Examiner* — Daborah Chacko-Davis
(74) *Attorney, Agent, or Firm* — Lippes Mathias LLP

(57) ABSTRACT

A photolithography exposure of a photoresist coating on a semiconductor wafer uses an optical projection system to form a latent image. The photolithography exposure further uses a mask with a set of multiple pattern focus (MPF) marks. Each MPF mark of includes features having different critical dimension (CD) sizes. The latent image is developed to form a developed photoresist pattern. Dimension sizes are measured of features of the developed photoresist pattern corresponding to the features of the MPF marks having different CD sizes. A spatial focus map of the photolithography exposure is constructed based on the measured dimension sizes. To determine the focal distance at an MPF mark, ratios or differences may be determined between the measured dimension sizes corresponding to the features of the MPF marks having different CD sizes, and the focal distance at the location of the MFP mark constructed based on the determined ratios or differences.

20 Claims, 8 Drawing Sheets

LITHOGRAPHY FOCUS CONTROL METHOD

This application claims the benefit of U.S. provisional application Ser. No. 63/220,072 filed Jul. 9, 2021 and titled "LITHOGRAPHY FOCUS CONTROL METHOD". U.S. provisional application Ser. No. 63/220,072 filed Jul. 9, 2021 and titled "LITHOGRAPHY FOCUS CONTROL METHOD" is incorporated herein by reference in its entirety.

BACKGROUND

The following relates to semiconductor fabrication arts, semiconductor lithographic patterning arts, photolithography arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
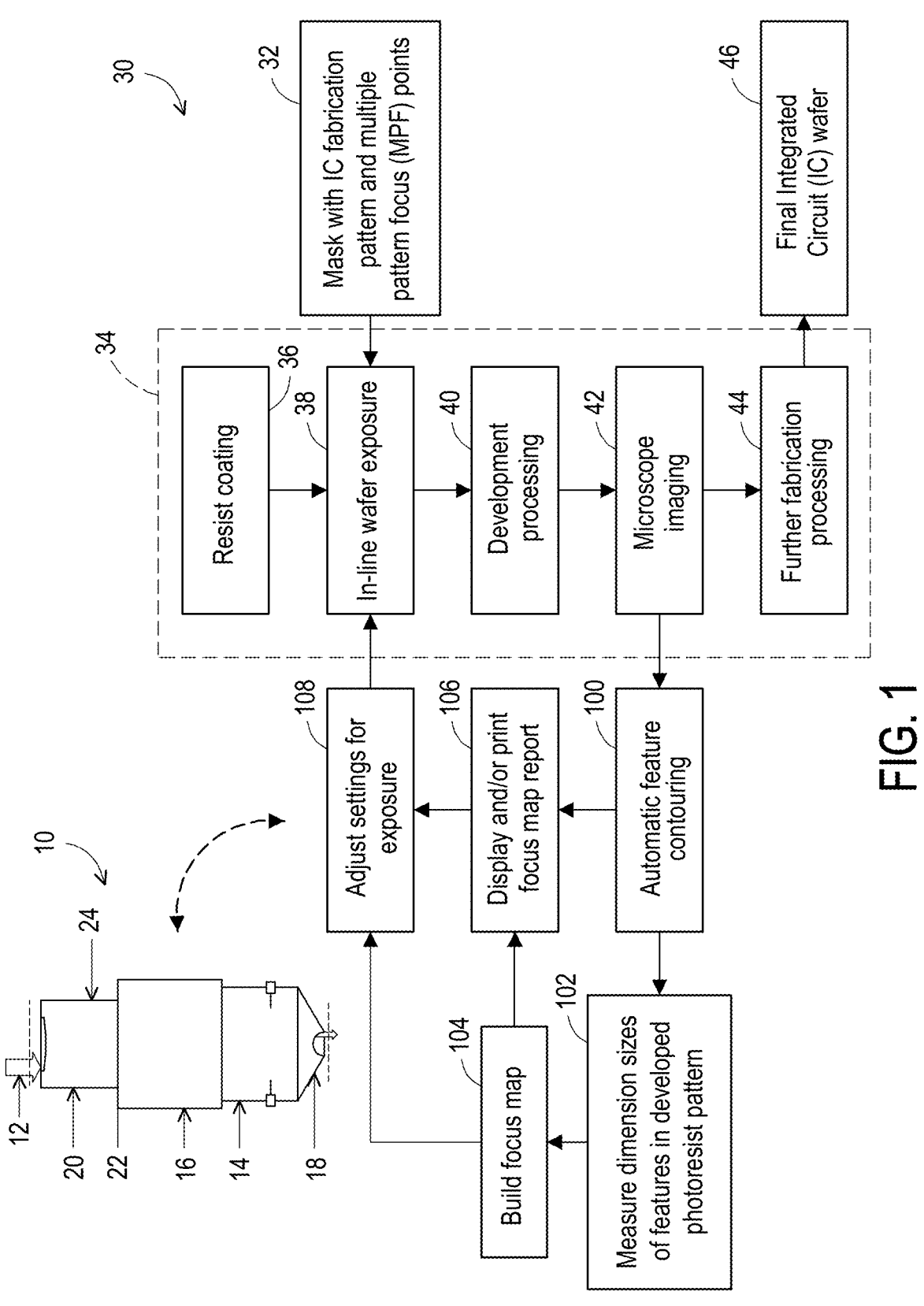
FIG. 1 diagrammatically illustrates a nonlimiting illustrative example of an optical projection system for use in a photolithography exposure, along with a method for assessing a photolithography exposure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference to FIG. 1, an illustrative optical projection system 10 is shown. The illustrative optical projection system 10 is a deep ultraviolet (DUV) optical projection system for use in DUV photolithography, which employs off-axis illumination 12 and includes a number of semi-active and/or active manipulators for achieving precise focus of light (in this case, DUV light) across an exposure area. A semi-active manipulator is relatively slow and is typically only used during lens setup, while an active manipulator is faster and is used for more frequent adjustments, e.g. to adjust the optical projection system 10 for a specific integrated circuit (IC) workflow. In the illustrative DUV photolithography optical projection system 10 may include semi-active manipulators such as: reticle (i.e. mask) stage translational manipulators (Rx and Ry, not indicated in FIG. 1); spherical aberration adjustment manipulators (SAXY manipulators, e.g. 6 manipulators in some embodiments) 14; various mirror manipulators (X, Y, Z, Rx, Ry) 16, and setup manipulators 18 for a wet exchangeable last lens element (WELLE). The lattermost semi-active manipulators are suitably provided in the case of immersion DUV lithography. The illustrative DUV photolithography optical projection system 10 may further include active manipulators such as: reticle stage (Z), not indicated; scanning NEXZ manipulators (e.g., six manipulators in some embodiments) 20; BALE (pressure) manipulators (e.g., two manipulators in some embodiments) 22; and various additional active manipulators 24 (e.g., WS translation X,Y manipulators, WS Rotation Rz manipulators, WS Focus (Z, Ry) manipulators).

It will thus be appreciated that the DUV photolithography optical projection system 10 has a large number of adjustable settings. The illustrative DUV photolithography optical projection system 10 is merely an example of the complexity of a modern photolithography optical projection system. As another example (not shown), an extreme ultraviolet (EUV) optical projection system typically comprises only mirrors (due to difficulties in constructing refractive optics operable at EUV wavelengths) and also employs an off-axis design and has a comparable number of adjustable settings. Furthermore, a photolithography exposure typically includes additional settings such as the wavelength of the light (e.g. DUV light wavelength or EUV light wavelength) used in the exposure, and the energy or dose of light used.

A photolithography exposure uses a photomask (also referred to herein as a "mask" for brevity; also sometimes referred to in the art as a "reticle") and the optical projection system to imprint a latent image on a photoresist coating disposed on a semiconductor wafer. Depending on the type of photolithography being done, the mask may be either a light-transmissive mask or a reflective mask. For example, immersion DUV lithography such as may use the illustrative DUV optical projection system 10 typically uses a transmissive mask, while EUV lithography typically uses a reflective mask due in part to the difficulty in fabricating a light transmissive mask operative at EUV wavelengths commonly used in EUV photolithography (e.g., about 13.5 nm EUV light in some cases). After the photolithography exposure forms the latent image in the photoresist coating, a development process is performed to form a developed photoresist pattern. The choice of developer formulation and other aspects of the development process are designed based on the type of photoresist (positive or negative, chemically amplified, et cetera), feature size considerations or so forth, and the developed photoresist pattern may be formed by removing photoresist that was exposed or unexposed to the light during the photolithography exposure, again depending on the type of photoresist.

One photolithography exposure setting that affects the quality of the developed photoresist pattern is the focal distance, that is, the effective distance from a reference plane of the optical projection system (e.g. the plane of the exit aperture of the WELLE, for example) and the photoresist coating. The "best" focus provides sharp features in the developed photoresist pattern. On the other hand, if the focal distance deviates from this "best" focal distance then this can result in resist top loss in which an upper portion of the photoresist is removed at edges of regions where the photoresist should remain in the developed photoresist pattern. Alternatively, focal distance deviation from the "best" focal distance can result in resist scumming, in which some photoresist remains at edges of regions where the photoresist should be removed during the development stage. Depending upon the projection geometry, the direction of the focal distance deviation, or other factors, the focal distance deviation can result in a dimension size of a feature of the developed photoresist pattern being too large, or too small. Other settings of the photolithography exposure can also impact quality of the developed photoresist pattern. For example, an excessive dose or energy of the exposure can result in removal of photoresist in regions where the resist should be retained, or conversely too-low dose or energy can result in photoresist remaining at boundaries where it should be removed.

To select the settings for a photolithography exposure, offline or pre-calibration is conventionally used. In this approach, multiple photolithography exposures are performed on different "test" photoresist-coated semiconductor wafers, with the settings of the optical projection system chosen to provide different focal distances. The dimension sizes of features of the developed photoresist pattern corresponding to the features of the MPF marks having different CD sizes are measured, e.g. using microscopy, and the dimension size as a function of focal distance is used to select the settings of the optical projection system that provide "best" focal distance with sufficient uniformity over the exposure area (e.g., over an entire semiconductor wafer in some cases). The settings adjustment may entail adjusting multiple active and/or semi-active manipulator settings to achieve the desired focal distance with acceptable uniformity across the wafer. Nonuniform focusing can manifest as various types of lens aberrations, such as coma in either the "X" direction or the "Y" direction or both, astigmatism, tilt, or so forth. Upon selection of the optimized photolithography exposure settings, a further verification run may be done on another "test" photoresist-coated semiconductor wafer to verify acceptable focus has been achieved. Thereafter, the selected photolithography exposure settings are used in subsequent photolithography exposures for fabrication of integrated circuits (ICs) (e.g., for sale to a buyer or for use directly by the semiconductor manufacturer in products).

Such an offline pre-calibration approach has a number of disadvantages. The pre-calibration occupies valuable time on the photolithography tool containing or including the optical projection system. During the pre-calibration, the tool cannot be used for productive IC manufacturing. The offline pre-calibration also provides no feedback during subsequent IC manufacturing runs. Hence, if the photolithography exposure tool changes in some respect due to wear, buildup of contamination, thermal cycling, or so forth so that the pre-calibrated settings are no longer suitable, this may not be detected until later in the fabrication process, possibly via indirect evidence such as IC components failing post-fabrication testing. Tracing such failures to problems with the photolithography exposure settings takes up further time, and may result in shutdown of the manufacturing line while the problem is resolved.

The "best" settings for a photolithography exposure also depend on the critical dimension (CD) size of the IC fabrication pattern being printed. Smaller CD sizes typically call for more precise focusing (that is, they have a smaller acceptable depth-of-focus). Achieving this precise focusing may involve a trade-off in which focus uniformity at the periphery of a wafer is sacrificed for focus accuracy in the central region of the wafer, even at the cost of lower die yield in the peripheral wafer region. On the other hand, the larger depth-of-focus typically permissible with a larger CD size may enable this tradeoff to be differently balanced, by sacrificing focus accuracy in the central region of the wafer to improve focus uniformity over the wafer and thus increase die yield in the peripheral wafer region. Hence, a pre-calibration performed for calibrating a photolithography exposure for printing an IC fabrication pattern with one CD size may not be ideal for printing an IC fabrication pattern with another CD size.

Still further, the pre-calibration may use special calibration masks, with different calibration masks being used for calibrating photolithography exposures for different CD sizes.

With continuing reference to FIG. 1, a method 30 for assessing a photolithography exposure is also diagrammatically shown. The method 30 advantageously can be performed in-line, in the sense that the photolithography exposure and subsequent development process used in the in-line photolithography exposure calibration are suitably simultaneously part of an IC fabrication workflow that produces an IC on a semiconductor wafer. To this end, the illustrative method 30 of assessing a photolithography exposure uses a photolithography mask 32 that includes both pattern focus points distributed over the wafer and an IC fabrication pattern. An IC manufacturing process 34 is performed, which includes coating a semiconductor wafer with photoresist in an operation 36, and performing a photolithography exposure 38 and subsequent development process 40 in-line as part of the IC manufacturing process 34. Thereafter, the developed photoresist pattern is imaged in an operation 42 by microscopy, such as scanning electron microscopy (SEM) or, if the feature size is large enough, optical microscopy. As will be described, the SEM or other microscope image is used for the lithography exposure assessment. The IC manufacturing process 34 then continues with further fabrication processing 44, such as for example performing lithographically defined etching, deposition, oxidation, dopant diffusion, various combinations thereof, and/or so forth using the developed photoresist pattern produced by the development processing 40 as for the lithographic definition. The further fabrication processing 44 usually includes other processing such as further photolithography steps (e.g., additional photolithography exposure/development cycles), and subsequent back end-of-line (BEOL) processing to provide metallization, and dicing to produce a final IC wafer (i.e., final semiconductor device wafer) 46 that is then diced to separate individual IC dies. The final semiconductor device wafer 46 also includes MPF marks. This is because the development processing 40 previously described produced the developed MPF mark photoresist patterns 74 (see FIG. 2(C)) corresponding to the MPF marks 60 of the mask 32 (see FIG. 2(A)). As these developed MPF mark photoresist patterns 74 are present during the further fabrication processing 44, the etching, deposition, oxidation, dopant diffusion, various combinations thereof, and/or so forth of the further fabrication processing 44 results in corresponding MPF marks being formed on the final semiconductor device wafer 46 in the form of etched MPF marks, deposited MPF marks, MPF marks delineated by oxidation, dopant diffusion, or so forth. These MPF marks are in the device areas of the ICs of the final semiconductor device wafer 46 and/or in the areas surrounding the device areas, depending on whether the MPF marks 60 of the mask 32 are in the IC fabrication pattern 52 and/or the surrounding frame 54 (see FIG. 2(A)). Although not shown, it will also be appreciated that the manufacturing process 34 may optionally include manufacturing steps that precede the resist coating 36 used in the in-line photolithography exposure assessment. For example, the manufacturing process 34 may optionally include previous photolithography steps (e.g., previous photolithography exposure/development cycles) or so forth that are performed prior to the resist coating 36 of the (current) photolithography cycle represented in FIG. 1 by the operations 36, 38, 40. The final IC wafer 46 includes MPF marks in the form of etched MPF marks, deposited MPF marks, MPF marks delineated by oxidation, dopant diffusion, or so forth produced by the fabrication processing 44. The MPF marks of the final semiconductor device wafer 46 are not part of the functional IC circuitry, but are readily detectable by microscopy (e.g., in the case of etched or deposited or oxidized MPF marks) or other suitable imaging techniques such as electron beam-induced current (EBIC) imaging. The final semiconductor device wafer 46 has a set of MPF marks, in which each MPF mark of the set of MFP marks has a same pattern comprising the set of features in which the features of the set of features have different critical dimension (CD) sizes. The number of MPF marks in the set of MPF marks on the final semiconductor device wafer 46 is in some embodiments at least 16 marks.

The microscopy imaging 42 may be an extra step inserted into the IC fabrication workflow 34. However, the imaging is typically a rapid process, and may optionally also provide imaging information for otherwise characterizing the in-progress IC fabrication. For example, the microscopy imaging 42 may be used to assess aspects of the printed IC fabrication pattern. Moreover, in some specific workflow scenarios the microscopy imaging 42 may be performed on a small subset of the IC wafer batches produced by the IC fabrication workflow 34. For example, if the IC manufacturing workflow 34 produces a number of wafers per hour (WPH) (by way of non-limiting illustrative example) and the photolithography exposure assessment is only performed on one wafer per day to perform daily assessment of the lithography exposure, then the impact on the overall workflow is very small.

Figure 2:
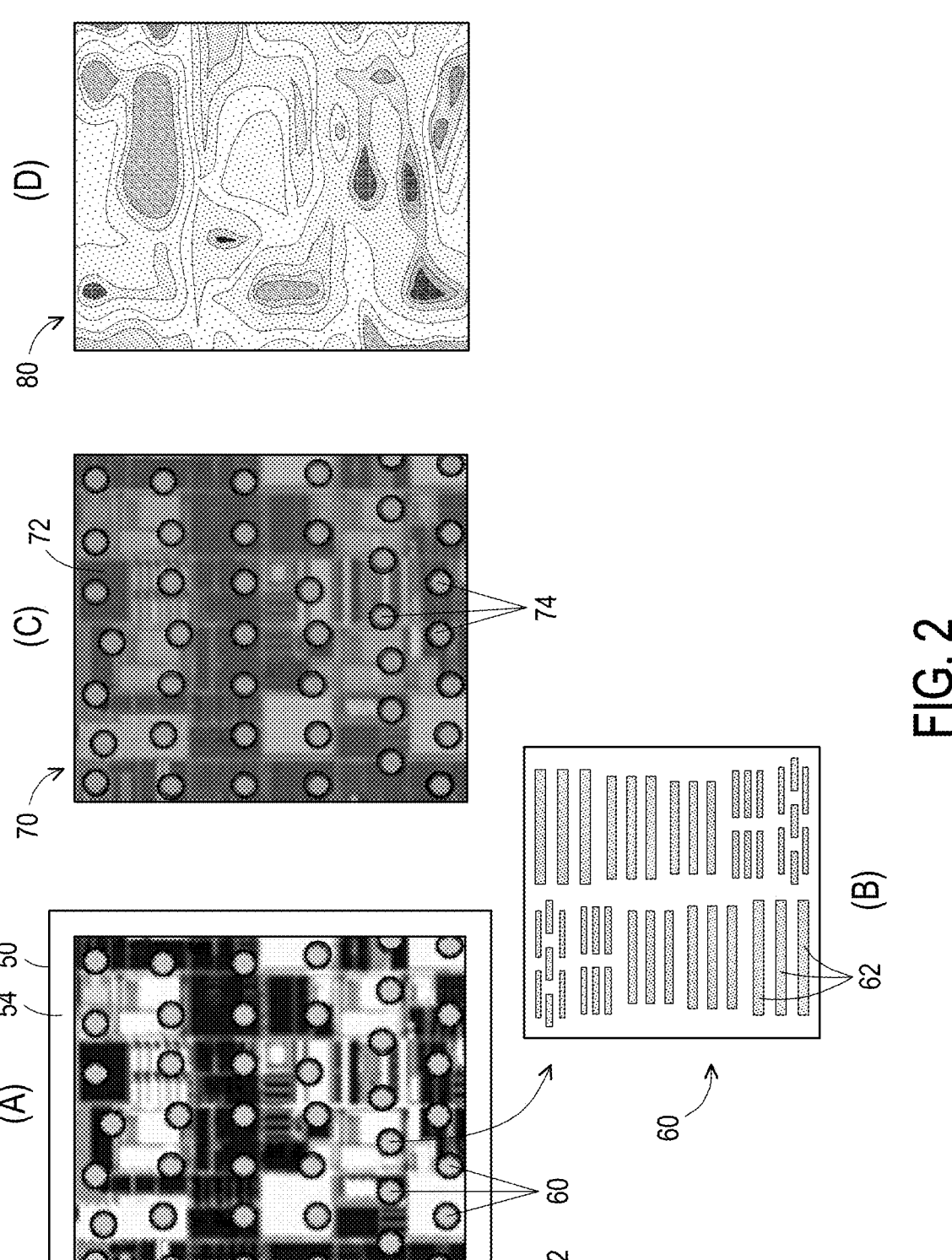
FIG. 2 diagrammatically illustrates (A) a mask used in photolithography which includes diagrammatically indicated multiple pattern focus (MPF) marks distributed across an integrated circuit (IC) fabrication pattern; (B) one of the MPF marks showing a set of features of different critical dimension (CD) sizes; (C) a photoresist coating on a semiconductor wafer which has been photolithographically patterned using the mask of part (A); and (D) a spatial focus map of a photolithography exposure constructed using a method such as that of FIG. 1.

With reference now to FIG. 2, an illustrative example of the mask 32 is described. The mask 32 includes a substrate 50 on which is disposed an IC fabrication pattern 52 that is designed to provide lithographic definition for a processing step in the IC manufacturing workflow 34. For example, the IC fabrication pattern 52 may define windows within which gates of field effect transistor (FET) devices are to be fabricated, or windows within which FET devices channels are to be fabricated, or windows within which metal contacts and/or interconnects are to be deposited, and/or so forth. The mask substrate 50 is typically a material such as borosilicate glass, fused silica, or another transparent material in the case of a transmissive mask, and the IC fabrication pattern 52 comprises a material with thickness and absorption coefficient sufficient to be opaque at the lithography wavelength. In the case of a reflective EUV mask, the substrate 50 is typically a low thermal expansion material (LTEM) and the IC fabrication pattern 52 typically comprises a distributed reflector such as a multilayer molybdenum/silicon (Mo/Si) stack. These are merely nonlimiting illustrative examples. The IC fabrication pattern 52 is typically surrounded by a frame 54 that is free of the material of the fabrication pattern 52 (or, alternatively, the frame 54 can include a continuous layer of the fabrication pattern material).

In addition, the mask 32 includes a set of multiple pattern focus (MPF) marks 60 comprising features of the same material as the IC fabrication pattern 52. Each MPF mark 60 comprises features having different critical dimension (CD) sizes. FIG. 2(B) shows one nonlimiting example of an illustrative MPF mark 60 with features 62 which are lines with different line widths (where line width is a CD) and different line lengths (where line length is a CD). As seen in FIG. 2(A), the MPF marks 60 are distributed across the IC fabrication pattern 52. Additionally or alternatively, some or all MPF marks may be distributed in the frame 54 of the mask 32 surrounding the IC fabrication pattern 52. In the illustrative case in which the MPF marks 60 are distributed across the IC fabrication pattern 52, they are suitably located in regions of the IC fabrication pattern 52 that do not overlap devices or other functional features of the IC under fabrication. For example, they may be interspersed between FETs, between dies, and/or so forth. The number of MPF marks 60 in the set of MPF marks is in some embodiments at least 16 marks. In FIG. 2(A) there are around 40 MPF marks 60 shown for illustration. More typically, the number of MPF marks distributed across the IC fabrication pattern 52 and/or frame 54 is hundreds of MPF marks, or thousands of MPF marks, or ten thousand or more MPF marks. A higher number of MPF marks 60 increases spatial resolution of the photolithography exposure assessment. In general, each MPF mark 60 of the set of MFP marks has the same pattern as the other MPF marks of the set, each comprising the set of features 62 in which the features of the set of features have different CD sizes. This permits focal distance assessment over the surface of the wafer.

There may, however, be more than one set of MPF marks, for example with different sets optimized to detect different types of lens aberrations. For example, a second set of MPF marks may also be disposed on the substrate 50, with each MPF mark of the second set of MFP marks having the same second pattern comprising a second set of features in which the features of the second set of features have different CD sizes. The second pattern of the MPF marks of the second set of MPF marks is generally different from the pattern of the MPF marks of the set of MPF marks. For example, the MPF marks of the first set of MPF marks may have horizontal line features of different CD sizes, while the MPF marks of the second set of MPF marks may have vertical line features of different CD sizes. See, e.g. FIGS. 6(A) and 6(B). Alternatively, the vertical and horizontal line features could be integrated into a single MPF mark. See, e.g. FIG. 6(C).

After performing the photolithography exposure 38 (see FIG. 1) a latent image corresponding to the IC fabrication pattern 52 and set of MPF marks 60 is formed on or in the photoresist coating the semiconductor wafer. After the subsequent development process 40 (see FIG. 1), the latent image is converted to a developed photoresist pattern. With reference to FIG. 2(C), an example of the developed photoresist pattern 70 is shown, including a developed photoresist pattern 72 corresponding to the IC fabrication pattern 52 of the mask 32 and developed MPF mark photoresist patterns 74 corresponding to the MPF marks 60 of the mask 32.

With reference to FIG. 2(D), based on measurements of the dimension sizes of features of the developed photoresist pattern corresponding to the features 62 of the MPF marks 60 (for example, measured from the microscope image acquired in microscopy operation 42 of FIG. 1), a spatial focus map 80 of the photolithography exposure is constructed based on the measured dimension sizes, as will be described further herein. Notably, the spatial resolution of the spatial focus map 80 is determined by the spatial density of the MPF marks 60 on the mask 32 (or equivalently, by the spatial density of the MPF mark photoresist patterns 74 on the exposed semiconductor wafer).

Figure 3:
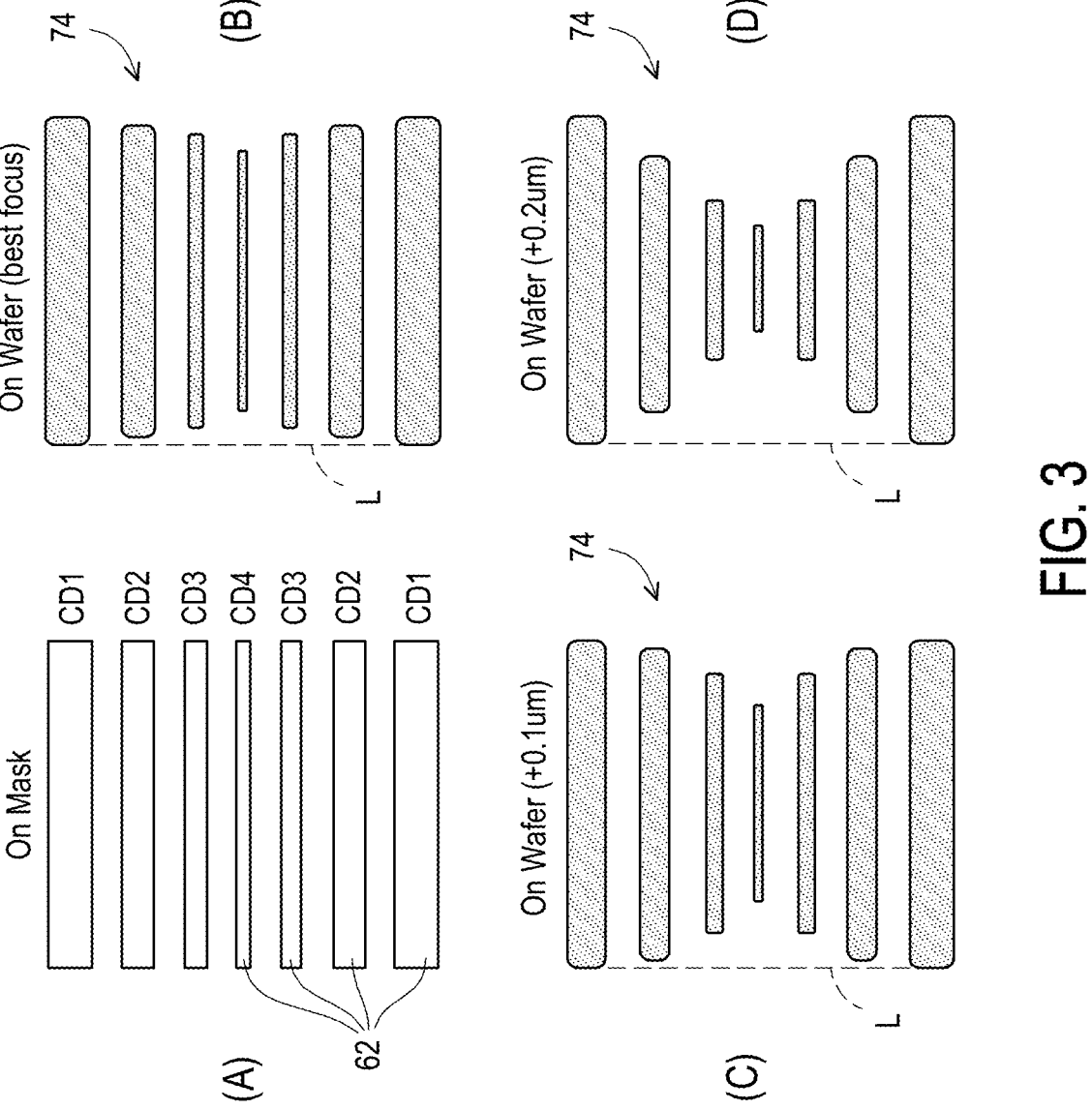
FIG. 3 diagrammatically illustrates: (A) line features of an MPF mark with different line width CD sizes; (B) a developed photoresist pattern corresponding to the MPF mark line features of part (A) with best focus; (C) a developed photoresist pattern corresponding to the MPF mark line features of part (A) with focal distance deviating from best focus by +0.1 micron; and (D) a developed photoresist pattern corresponding to the MPF mark line features of part (A) with focal distance deviating from best focus by +0.2 micron.

With reference to FIG. 3, the impact of different focal distances on the developed photoresist pattern is illustrated. FIG. 3(A) shows features 62 of a MPF mark on the mask 32. As can be seen the features 62 of FIG. 3(A) are line features with different line widths. Thus, here the CD is the line width, and this example has features with four CD sizes: CD1, CD2, CD3, and CD4 with the line width decreasing for each step down. That is, CD1>CD2>CD3>CD4 where CDx denotes the line width. On the other hand, the line length for each feature is the same.

FIG. 3(B) diagrammatically illustrates a developed MPF mark photoresist pattern 74 corresponding to the features 62 of FIG. 3(A) obtained on the semiconductor wafer after the photoresist exposure 38 and development processing 40 (see FIG. 1), when using the focal distance providing most accurate printing of the MPF mark features 62. This is referred to as "best focus". As seen, the developed MPF mark photoresist pattern 74 are not a perfect replica of the MPF mark features 62. The features 62 with the largest CD1 are reproduced in the developed MPF mark photoresist pattern 74 with the length and width of the lines accurately reproduced, and only some rounding of the sharp corners being observable. On the other hand, the feature with the smallest CD4 is reproduced in the developed MPF mark photoresist pattern 74 with the ends of the line feature significantly shortened so that the total length of the reproduced line is significantly reduced compared with the corresponding MPF mark feature 62 with smallest CD4. Additionally, the line width of the reproduced line feature is perceptibly reduced compared with the line width of the corresponding MPF mark feature 62 with smallest CD4. As seen in FIG. 3(B), the features of the developed MPF mark photoresist pattern 74 with intermediate CD2 and CD3 exhibit these dimensional changes relative to the corresponding CD features 62 to intermediate degrees. As can be observed when comparing the left ends of the line features of the developed MPF mark photoresist pattern 74 against the superimposed vertical dashed line L indicating the length of the CD features 62, the shortening of the line features increases with decreasing CD size, with the line length of the printed feature corresponding to CD1 being longer than the line length of the printed feature corresponding to CD2 being longer than the line length of the printed feature corresponding to CD3 being longer than the line length of the printed feature corresponding to CD4.

These changes in the measured dimension sizes for the developed MPF mark photoresist pattern 74 are generally attributable to optical diffraction or light leakage at the boundaries of the MPF mark feature 62. The diffraction or light leakage causes increased light exposure at the ends of the line feature 62 with narrow CD4 to cause the development process to remove photoresist material at the ends, leading to the line length shortening of the corresponding developed MPF mark photoresist pattern 74. Similarly, the light diffraction or leakage at the long edge of the feature produces thinning of the printed line feature. More generally, diffraction and/or light leakage effects during the photoresist exposure 38 can alter the measured dimension sizes of features of the developed MPF mark photoresist pattern, and these effects are generally more pronounced for smaller CD sizes. The increased change in measured dimension sizes can be qualitatively understood as follows. The spatial extent of the diffraction or light leakage is the same for all CD sizes since it is an edge effect. Thus, a ratio of the spatial extent of the diffraction or light leakage to the CD size increases with decreasing CD size.

Moreover, the amount of light diffraction and/or light leakage during the photoresist exposure 38 increases as the focal distance deviation from the best focus increases. This leads to the changes in measured dimension sizes of features of the developed MPF mark photoresist pattern generally increasing with increasing deviation from the best focus. Put another way, the ratio of the spatial extent of the diffraction or light leakage to the CD size for any given CD size increases with increasing focus deviation because of the corresponding increasing spatial extent of the diffraction or light leakage while the given CD size remains constant.

With reference to FIGS. 3(C) and 3(D), this effect of increasing deviation from best focus on measured dimension sizes of the developed MPF mark photoresist pattern 74 is illustrated. FIG. 3(C) illustrates the case for a +0.1 micron deviation from the best focus of FIG. 3(B), while FIG. 3(D) illustrates the case for a +0.2 micron deviation. As best seen when looking at the reproduced line feature with smallest CD4, the line length decreases steadily from best focus (FIG. 3(B)) to +0.1 micron focus deviation (FIG. 3(C)) to +0.2 micron focus deviation (FIG. 3(D)). The effect of increasing focus deviation on the larger CD sizes is gradually less, with the line length for the printed features with CD1 showing no observable change as the focus deviation goes from best focus to +0.1 micron focus deviation to +0.2 micron focus deviation.

It is recognized herein that this effect of the changes in measured dimension sizes of features of the developed MPF mark photoresist pattern generally increasing with increasing deviation from the best focus, but by different amounts at different CD sizes, can be leveraged to determine the focal distance at any given multiple pattern focus (MPF) mark 60. In general, the dimension sizes of the features with different CD sizes in the MPF mark 60 are measured, and ratios or differences between the measured dimension sizes are determined. The focal distance of the photolithography exposure at a location of the MPF mark 60 (and hence the focal length at the location in the spatial focus map 80 corresponding to that MFP mark) is determined based on the determined ratios or differences.

Figure 4:
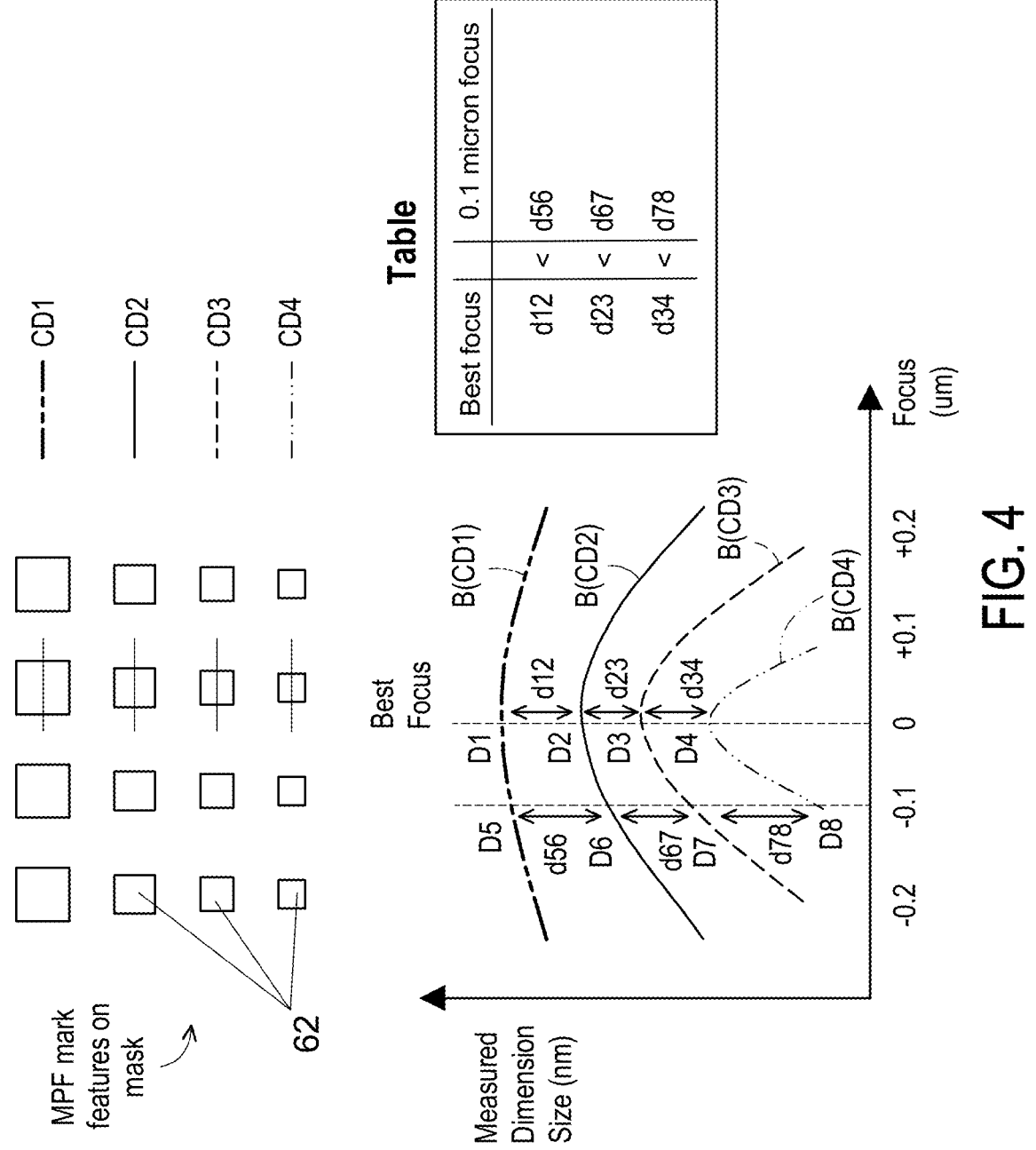
FIG. 4 diagrammatically illustrates an example of determining a focal distance at an MPF mark based on ratios or differences between measured dimension sizes of a developed photoresist pattern corresponding to features of the MPF marks having different CD sizes.

With reference to FIG. 4, this is illustrated. The top portion of FIG. 4 shows at least a portion of an MPF that includes square features 62 with different side lengths, so that the side length is the CD. Four CD sizes identified as CD1, CD2, CD3, and CD4 are included in the features 62. The bottom portion of FIG. 4 plots the measured dimension sizes for the printed features of the developed MPF mark photoresist pattern (not shown in FIG. 4) as a function of focus deviation, for each of CD1, CD2, CD3, and CD4. The x-axis of the plot is the focus deviation in microns, so that 0 corresponds to best focus. D1, D2, D3, and D4 indicated in the plot are the measured dimension sizes for printed features corresponding to the mask features 62 with CD1, CD2, CD3, and CD4, respectively. As expected, at best focus D1>D2>D3>D4, since CD1>CD2>CD3>CD4. This ordering of the measured dimension sizes is also seen at every focus deviation, reflecting CD1>CD2>CD3>CD4.

However, the rate at which the measured dimension size decreases with increasing focus deviation is different for different CD sizes. Each CD size is represented across the focus deviations by a curved line, known as a Bossung curve. Hence, CD1 has a corresponding Bossung curve B(CD1); CD2 has a corresponding Bossung curve B(CD2); CD3 has a corresponding Bossung curve B(CD3); and CD4 has a corresponding Bossung curve B(CD4). As can be seen, curve B(CD1) is flatter than curve B(CD2), which is flatter than curve B(CD3), while curve B(CD4) ha the most curvature. As a consequence, the ratios or differences of the measured dimension sizes for CD1, CD2, CD3, and CD4 are characteristic of the focus deviation. This is shown for best focus and −0.1 micron deviation in the Table also presented in FIG. 4. As diagrammatically shown on the plot, for best focus difference d12=D1−D2, difference d23=D2−D3, and difference d34=D3−D4. For indicated measured dimension sizes D5, D6, D7, and D8 at −0.1 micron focus deviation corresponding to CD1, CD2, CD3, and CD4 respectively, the analogous distances are difference d56=D5−D6, d67=D6−D7, and d78=D7−D8. Due to the larger diffraction, as shown in the Table of FIG. 4 d12<d56, d23<d67, and d34<d78.

Generalizing this, ratios or differences of measured dimension sizes of the features of the developed photoresist pattern corresponding to the features of the MPF marks having different CD sizes are indicative of the focus deviation. Thus, the photolithography exposure 38 of FIG. 1 can be assessed as follows. The latent image produced by the exposure is developed in operation 40 of FIG. 1 to form a developed photoresist pattern. In the operation 42, the dimension sizes of the features of the printed MPF marks 74 of the developed photoresist pattern 70 corresponding to the features 62 of the MPF marks 60 having different CD sizes (see FIG. 2) are measured, typically using SEM or optical microscopy. A spatial focus map 80 of the photolithography exposure is then constructed based on the measured dimension sizes, for example by determining, for each MPF mark, ratios or differences between the measured dimension sizes for different CD sizes and determining the focal distance of the photolithography exposure 38 at a location of the spatial focus map 80 corresponding to the MFP mark based on the determined ratios or differences.

With reference back to FIGS. 1 and 2, the building of the spatial focus map 80 using the microscope image acquired in the operation 42 can be performed as follows. In an operation 100, the features of the developed photoresist pattern corresponding to the features of the MPF marks having different CD sizes are automatically contoured in the microscope image to produce feature contours. In an operation 102, the dimension sizes are measured using the feature contours. The focus map 80 is built in an operation 104, for example using the measured dimension sizes, e.g. based on ratios or differences of the measured dimension sizes, at each MPF mark to determine the focus deviation for the focus map location corresponding to that MPF mark. The transform from the measured dimension sizes to the focus deviation can be variously implemented. As some nonlimiting illustrative examples, a calibration table can be constructed using offline calibration runs to link specific ratio or difference sets to specific focus deviations, so that the transform can be implemented as a look-up table. In another approach, an artificial intelligence (AI) component can be trained using such calibration data and then applied to the measured dimension sizes to output the focus deviation.

The resulting spatial focus map 80 of the photolithography exposure 38 can be variously used. For example, in an optional operation 106 the spatial focus map 80 can be displayed on a display of a computer (not shown), and/or printed on a printer. In one nonlimiting suitable approach, the focus map can be presented as a heat map, with increasingly cooler (i.e. bluer) regions indicating increasingly negative focus deviation and increasingly hotter (i.e. redder) regions indicating increasingly positive focus deviation. The reporting operation 106 may also include providing further analysis report information, such as providing quantitative statistical values for the spatial focus map 80, such as the maximum positive focus deviation, the maximum negative focus deviation, an average focus deviation, or so forth.

The reporting operation 106 can additionally or alternatively identify one or more lens aberrations of the optical projection system 10 based on the spatial focus map 80 of the photolithography exposure 38. For example, the spatial focus map 80 can be compared with ANSI standard Zernike modes to identify lens aberrations such as coma in the x-direction, coma in the y-direction, astigmatism, x-direction tilt, y-direction tilt, and/or so forth.

In an optional operation 108, the spatial focus map 80 generated in the operation 104, and/or information extracted therefrom in the reporting operation 106, can optionally be used to automatically or semi-automatically adjust manipulators 14, 16, 18, 20, 22 of the optical projection system 10. For example, if the operation 106 identifies a lens aberration and the manufacturer of the optical projection system 10 provides a manipulator adjustment procedure for correcting that lens aberration then the operation 108 can propose those adjustments to the user, or in a more automated embodiment can automatically apply those adjustments to the optical projection system 10.

Figure 5:
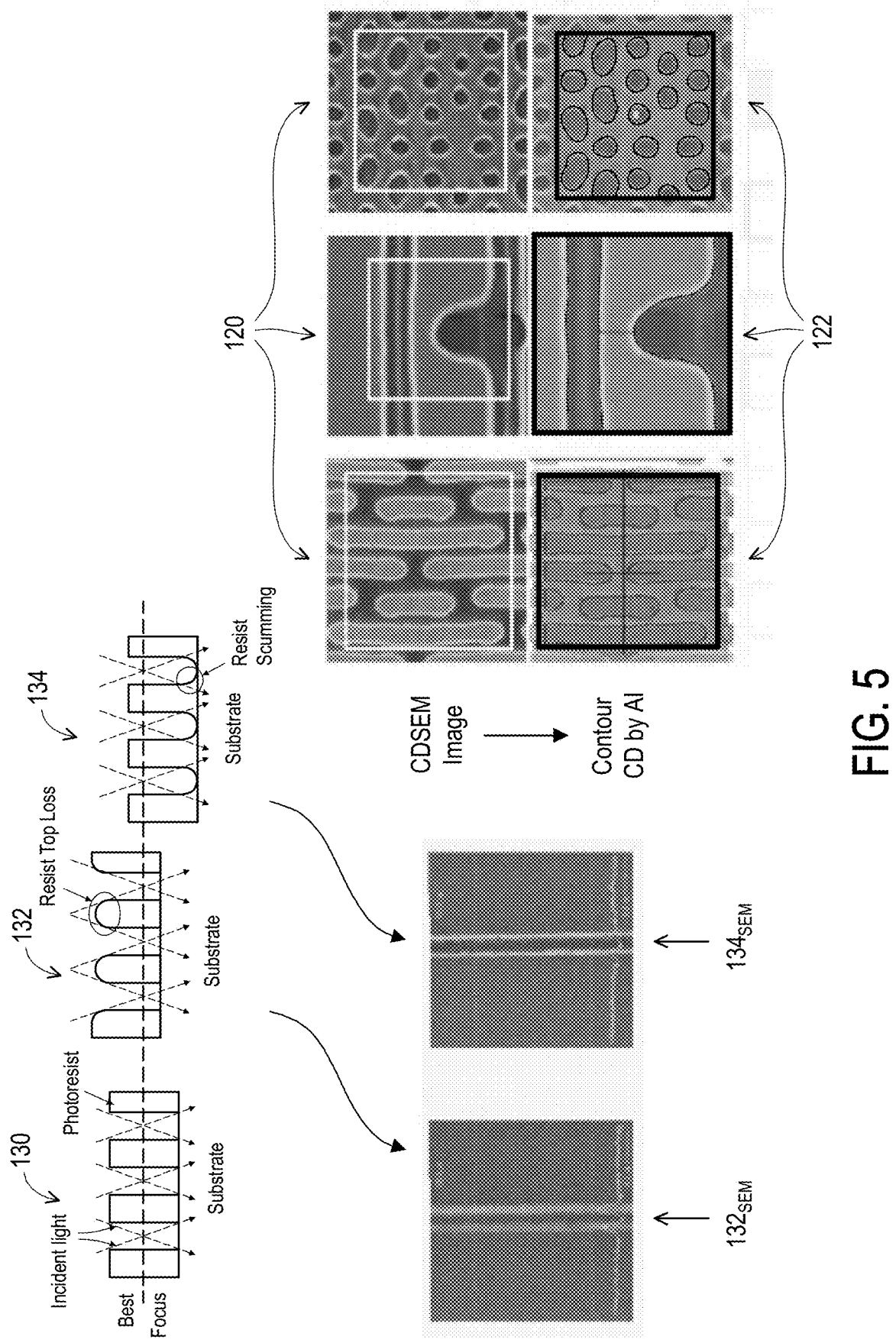
FIG. 5 diagrammatically illustrates an approach for automatic contouring of features of a developed photoresist pattern in a scanning electron microscope (SEM) image to perform CDSEM contour mapping.

With reference to FIG. 5, the automatic feature contouring operation 100 of FIG. 1 is diagrammatically shown. The input are microscope images 120, such as SEM images, of the developed photoresist pattern 72 (see FIG. 2), and more particularly of the developed MPF mark photoresist patterns 74 corresponding to the MPF marks 60 of the mask 32. The automatic feature contouring 100 may apply an artificial intelligence (AI) component to the microscope images 120 to produce the feature contours 122. By way of nonlimiting illustration, the AI component may comprise a convolutional neural network (CNN) trained on sample microscope images in which the features were contoured by hand (providing ground truth contours for the training).

With continuing reference to FIG. 5 and with brief reference back to FIG. 4, it may be noted that the Bossung curves B(CD1), B(CD2), B(CD3), and B(CD4) are somewhat symmetric about the best focus vertical line. As such, reliance upon the Bossung curves alone (or analogous ratios or differences between the measured dimension sizes of the features of the developed photoresist pattern corresponding to the features of the MPF marks having different CD sizes) in determining the focal distance may have difficulty distinguishing whether the focus deviation is positive or negative. On the other hand, as seen in FIG. 5, the detailed analysis of the contours can facilitate disambiguating positive versus negative focus deviation. FIG. 5 presents diagrammatic representations of the light rays in the case of best focus (diagram 130), in the case of a positive focus deviation 130 leading to resist top loss (diagram 132), and in the case of a negative focus deviation 134 leading to photoresist scumming (diagram 134). As seen in the SEM image $132_{SEM}$ for resist top loss versus the SEM image $134_{SEM}$ for scumming, these situations are readily distinguished in the SEM image. Hence, for example, an AI component can be trained to distinguish resist top loss versus scumming (separately from the AI component used in the contouring) and thereby determine the positive or negative direction of the focus deviation.

Figure 6:
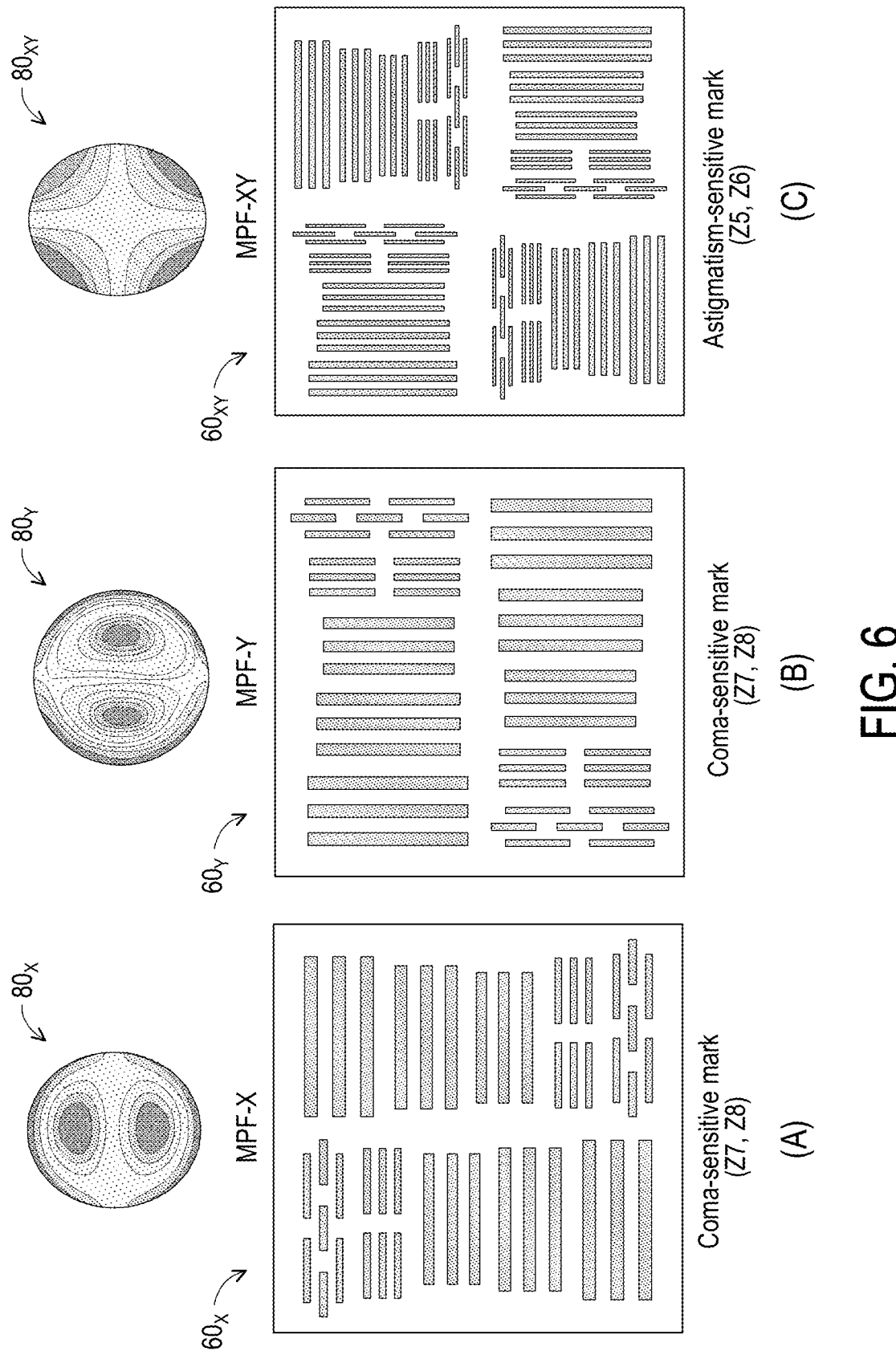
FIG. 6 diagrammatically illustrates examples of MPF marks with features of different CD sizes for assessing (A) coma in a vertical (X) direction, (B) coma in a horizontal (Y) direction, and (C) astigmatism.

With reference to FIG. 6, some further examples of multiple pattern focus (MPF) marks 60 with different CD sizes which are optimized for detecting specific types of lens aberrations are shown, along with spatial focus maps 80 exhibiting those lens aberrations. FIG. 6(A) shows an MPF-X mark $60_X$ with horizontal (respective to the page) line features that is sensitive to horizontal coma (corresponding to Zernike modes Z7, Z8). A spatial focus map $80_X$ exhibiting the horizontal coma lens aberration is also shown. FIG. 6(B) shows an MPF-Y mark $60_Y$ with vertical (respective to the page) line features that is sensitive to vertical coma. The spatial focus map $80_Y$ exhibiting the vertical coma lens aberration is also shown. FIG. 6(C) shows an MPF-XY mark $60_{XY}$ with both horizontal and vertical line features that is sensitive to horizontal or vertical coma or astigmatism. The spatial focus map $80_{XY}$ exhibiting the astigmatism lens aberration is also shown.

Figure 7:
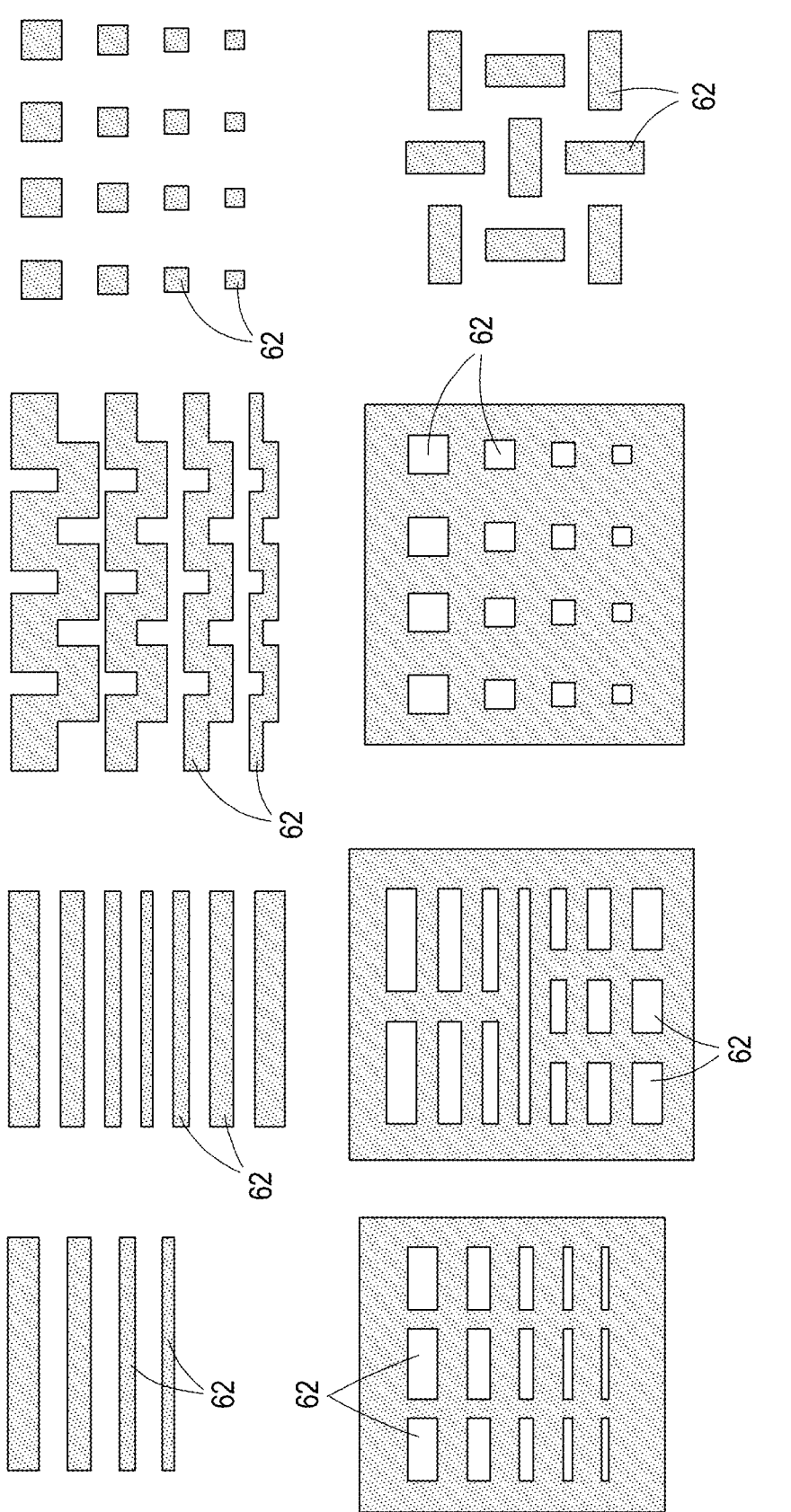
FIG. 7 diagrammatically illustrates additional patterns of features of different CD sizes that may be suitably form or be incorporated into a MPF mark.

FIG. 7 illustrates other examples of features 62 suitably used in the MPF marks 60. These are to be understood as merely nonlimiting illustrative examples, which can be variously combined in a given MPF mark. As seen in FIG. 7, the various features 62 may have different CDs, and may also have different shapes and/or different orientations on the substrate 50. While horizontal and vertical orientations are illustrated, it is contemplated to include features with oblique orientations as well. The lower right example of FIG. 7 also shows an example of features having a non-grid pattern.

Another setting of the photolithography exposure 38 that can impact the quality of the developed photoresist pattern is the exposure energy or dose of the light used in performing the exposure. The energy or exposure is the optical power used in the exposure integrated over the exposure time. Hence, the exposure energy can be increased by using a higher light intensity, or by using a longer exposure time, or by a combination of these mechanisms. Using higher light energy can lead to higher light exposure in boundary areas, for example leading to shortening of line features of small critical dimension, similar to the effects seen in FIG. 3 for the smallest CD4 lines. Conversely, using lower light energy can lead to incomplete exposure of photoresist at boundary areas. Either effect can lead to loss or degradation of features.

Figure 8:
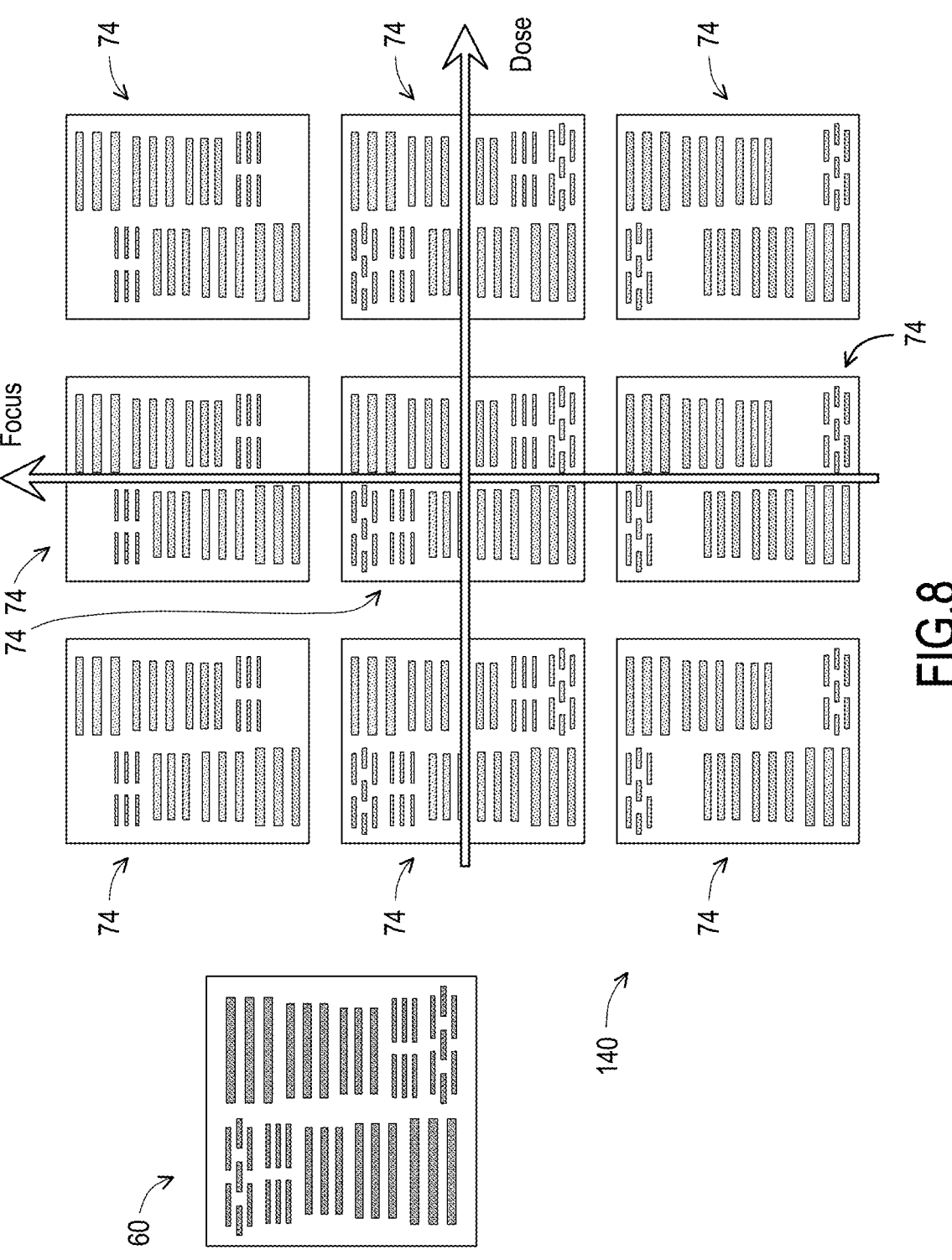
FIG. 8 diagrammatically illustrates a focus-energy matrix (FEM) at an MPF mark.

With reference to FIG. 8, the disclosed approaches for assessing the photolithography exposure 38 can be extended to assessing impact of exposure energy as follows. The photolithography exposure 38 includes multiple exposures performed of different photoresist coatings on different semiconductor wafers with different exposure energy settings to form corresponding latent images corresponding to the different exposure energy settings. When integrated into IF fabrication production runs, this requires changing the exposure time and/or light intensity used in successive wafer exposures. FIG. 8 diagrammatically depicts a MPF mark 60 and corresponding developed photoresist patterns 74 produced by such multiple exposures at different exposure energies and focus deviations. The microscope images can be combined to construct a focus-energy matrix (FEM) 140 as shown in FIG. 8 based on the multiple exposures. The FEM matrix 140 can be analyzed to determine optimal focus and exposure energy for the photolithography exposure 38.

With returning reference to FIG. 1, the automatic feature contouring operation 100, the measurement operation 102, the spatial focus map building operation 104, and the report generation operation 106 are typically performed by a computer, by executing instructions stored on a non-transitory storage medium (e.g., a hard drive or other magnetic storage medium, an optical disk or other optical storage medium, a solid state drive, flash drive or other electronic storage medium, various combinations thereof or so forth). In the operation 106, the report including the spatial focus map and other report information can be displayed on a display of the computer, and/or printed using an operatively connected printer, or otherwise utilized.

In the illustrative examples, the photolithography mask 32 includes both the IC fabrication pattern 52 and set of MPF marks 60 distributed over the IC fabrication pattern 52 and/or the surrounding frame 54. The advantageously enables the photolithography exposure assessment to be performed using in-line IC wafer production exposures that utilize the IC fabrication pattern 52. However, it is alternatively contemplated to omit the IC fabrication pattern 52, in which case the mask would only include the distribution of MPF marks 60 over the substrate 50, and would only be used for exposure assessment.

In the following, some further embodiments are described.

In a nonlimiting illustrative embodiment, a method of assessing a photolithography exposure is disclosed. The photolithography exposure of a photoresist coating on a semiconductor wafer is performed using an optical projection system to form a latent image. The photolithography exposure further uses a mask comprising a set of multiple pattern focus (MPF) marks wherein each MPF mark of the set of MFP marks comprises features having different critical dimension (CD) sizes. The latent image is developed to form a developed photoresist pattern. Dimension sizes are measured of features of the developed photoresist pattern corresponding to the features of the MPF marks having different CD sizes. A spatial focus map of the photolithography exposure is constructed based on the measured dimension sizes.

In a nonlimiting illustrative embodiment, a photolithography mask is disclosed, comprising a substrate and a set of MPF marks disposed on the substrate. Each MPF mark of the set of MFP marks has a same pattern comprising a set of features in which the features of the set of features have different CD sizes.

In a nonlimiting illustrative embodiment, a photolithography mask is disclosed, comprising a substrate and a set of MPF marks disposed on the substrate. Each MPF mark of the set of MFP marks has a same pattern comprising a set of features in which the features of the set of features have different CD sizes. There may also be an integrated circuit (IC) fabrication pattern disposed on the substrate, and the MPF marks of the set of MPF marks may be distributed across the IC fabrication pattern and/or in a frame of the photolithography mask surrounding the IC fabrication pattern.

In a nonlimiting illustrative embodiment, a semiconductor device wafer includes integrated circuit (IC) patterns occupying device areas of the semiconductor device wafer, and a set of multiple pattern focus (MPF) marks disposed in the device areas and/or in areas surrounding the device areas. Each MPF mark of the set of MFP marks has a same pattern comprising a set of features in which the features of the set of features have different critical dimension (CD) sizes.

In a nonlimiting illustrative embodiment, a method of assessing a photolithography exposure is disclosed. The method includes performing the photolithography exposure of a photoresist coating on a semiconductor wafer using an optical projection system to form a latent image. The photolithography exposure further uses a mask comprising an IC fabrication pattern and a set of MPF marks distributed across the IC fabrication pattern and/or a frame of the mask surrounding the IC fabrication pattern wherein each MPF mark of the set of MFP marks comprises features having different CD sizes. The method further includes: developing the latent image to form a developed photoresist pattern corresponding to the photolithography exposures; measuring dimension sizes of features of the developed photoresist pattern corresponding to the features of the MPF marks having different CD sizes; determining focal distances of the photolithography exposure at the respective MFP marks based on the measured dimension sizes; assessing the photolithography exposure based on the determined focal distances of the photolithography exposure at the respective MFP marks; and after the measuring, performing fabrication processing on the semiconductor wafer to produce an integrated circuit (IC) wafer in accordance with the IC fabrication pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of assessing a photolithography exposure, the method comprising:

performing the photolithography exposure of a photoresist coating on a semiconductor wafer using an optical projection system to form a latent image, the photolithography exposure further using a mask comprising a set of multiple pattern focus (MPF) marks wherein each MPF mark of the set of MFP marks comprises features having at least four different critical dimension (CD) sizes;

developing the latent image to form a developed photoresist pattern;

measuring dimension sizes of features of the developed photoresist pattern corresponding to the features of the MPF marks having at least four different CD sizes;

constructing a spatial focus map of the photolithography exposure based on the measured dimension sizes; and determining at least one lens aberration of the optical projection system based on the spatial focus map of the photolithography exposure.

2. The method of claim 1, wherein the measuring of the dimension sizes of the features of the developed photoresist pattern corresponding to the features of the MPF marks having at least four different CD sizes includes:

acquiring at least one scanning electron microscope (SEM) image of the developed photoresist pattern; and measuring the dimension sizes in the at least one SEM image.

3. The method of claim 1, wherein the measuring of the dimension sizes of the features of the developed photoresist pattern corresponding to the features of the MPF marks having at least four different CD sizes includes:

acquiring a microscope image of the developed photoresist pattern;

automatically contouring the features of the developed photoresist pattern corresponding to the features of the MPF marks having at least four different CD sizes in the microscope image to produce feature contours;

determining photoresist top loss and/or scumming based on the automatic contouring;

determining positive or negative direction of a focus deviation based on the determination of photoresist top loss and/or scumming; and measuring the dimension sizes using the feature contours;

wherein the constructing a spatial focus map of the photolithography exposure is further based on the determined positive or negative direction of the focus deviation.

4. The method of claim 3, wherein the automatic contouring comprises using a convolutional neural network (CNN) to produce the feature contours from the microscope images.

5. The method of claim 1, wherein the constructing of the spatial focus map of the photolithography exposure includes, for each MFP mark:

determining ratios or differences between the measured dimension sizes of the features of the developed photoresist pattern corresponding to the features of the MPF marks having at least four different CD sizes; and determining a focal distance of the photolithography exposure at a location of the spatial focus map corresponding to the MFP mark based on the determined ratios or differences.

6. The method of claim 1, wherein the mask further comprises an integrated circuit (IC) fabrication pattern and the set of MPF marks are distributed across the IC fabrication pattern and/or in a frame of the mask surrounding the IC fabrication pattern.

7. The method of claim 6, further comprising:

after the measuring of the dimension sizes of the features of the developed photoresist pattern corresponding to the features of the MPF marks having at least four different CD sizes, performing fabrication processing on the semiconductor wafer to produce an integrated circuit (IC) wafer in accordance with the IC fabrication pattern.

8. The method of claim 1, wherein:

the photolithography exposure includes multiple exposures performed of different photoresist coatings on different semiconductor wafers with different exposure energy settings to form corresponding latent images corresponding to the different exposure energy settings; and constructing a focus-energy matrix (FEM) for each MPF mark of the set of MPF marks based on the multiple exposures.

9. The method of claim 1, wherein the features having at least four different critical dimension (CD) sizes comprise seven parallel lines having a same line length and arranged as a first set of two outermost lines having a width of a first CD, a second set of two lines adjacent the two outermost lines that have a width of a second CD, a third set of two lines adjacent the lines of the second set of lines that have a width of a third CD, and a central line having a width of a fourth CD, wherein the first CD is greater than the second CD, the second CD is greater than the third CD, and the third CD is greater than the fourth CD.

10. The method of claim 1, wherein one of:

the optical projection system is a deep ultraviolet (DUV) projection system used in DUV photolithography and the photolithography exposures are performed using DUV light; or the optical projection system is an extreme ultraviolet (EUV) projection system used in EUV photolithography and the photolithography exposures are performed using EUV light.

11. The method of claim 1, wherein the determined at least one lens aberration comprises at least one of: a coma, an astigmatism, and a tilt.

12. A method of assessing a photolithography exposure, the method comprising:

performing the photolithography exposure of a photoresist coating on a semiconductor wafer using an optical projection system to form a latent image, the photolithography exposure further using a mask comprising an integrated circuit (IC) fabrication pattern and a set of multiple pattern focus (MPF) marks distributed across the IC fabrication pattern and/or a frame of the mask surrounding the IC fabrication pattern wherein each MPF mark of the set of MFP marks comprises features having at least four different critical dimension (CD) sizes;

developing the latent image to form a developed photoresist pattern;

performing in-line photolithography exposure calibration including:

measuring dimension sizes of features of the developed photoresist pattern corresponding to the features of the MPF marks having at least four different CD sizes;

determining focal distances of the photolithography exposure at the respective MFP marks based on the measured dimension sizes;

identifying at least one lens aberration of the optical projection system based on the determined focal distances of the photolithography exposure; and automatically adjusting manipulators of the optical projection system to correct the at least one lens aberration of the optical projection system identified based on the determined focal distances of the photolithography exposure; and after the measuring, performing fabrication processing on the semiconductor wafer to produce an integrated circuit (IC) wafer in accordance with the IC fabrication pattern, the fabrication processing including performing at least one subsequent photolithography exposure/development cycle using the optical projection system with the corrected at least one lens aberration.

13. The method of claim 12, wherein the determining of the focal distances of the photolithography exposure at the respective MFP marks based on the measured dimension sizes includes:

for each MPF mark, determining ratios or differences between the measured dimension sizes of the features of the developed photoresist pattern corresponding to the features of the MPF marks having different CD sizes.

14. A method of assessing a photolithography exposure, the method comprising:

performing a photolithography exposure of a photoresist coating on a semiconductor wafer to form a latent image, the photolithography exposure using an optical projection system and a mask comprising a set of focus marks wherein each focus mark of the set of focus marks comprises features having at least four different dimension sizes;

developing the latent image to form a developed photoresist pattern;

measuring dimension sizes of features of the developed photoresist pattern corresponding to the features of the focus marks by acquiring at least one scanning electron microscope (SEM) image of the developed photoresist pattern and measuring the dimension sizes of the features in the at least one SEM image;

identifying photoresist top loss and/or scumming based on automatic contouring of the features of the developed photoresist pattern corresponding to the features of the focus marks; and constructing a spatial focus map of the photolithography exposure based on the measured dimension sizes, including determining positive or negative directions of focus deviations based on the identified photoresist top loss and/or scumming.

15. The method of claim 14, wherein the constructing of the spatial focus map of the photolithography exposure includes, for each focus mark:

determining ratios or differences between the measured dimension sizes of the features of the developed photoresist pattern corresponding to the features of the focus marks having at least four different dimension sizes; and determining a focal distance of the photolithography exposure at a location of the spatial focus map corresponding to the focus mark based on the determined ratios or differences.

16. The method of claim 14, further comprising determining a coma of the optical projection system based on the spatial focus map of the photolithography exposure.

17. The method of claim 14, further comprising determining an astigmatism of the optical projection system based on the spatial focus map of the photolithography exposure.

18. The method of claim 14, further comprising determining a tilt of the optical projection system based on the spatial focus map of the photolithography exposure.

19. The method of claim 14, further comprising:

determining at least one lens aberration of the optical projection system based on the spatial focus map of the photolithography exposure; and automatically adjusting manipulators of the optical projection system based on the determined at least one lens aberration.

20. The method of claim 19, wherein the determining of at least one lens aberration of the optical projection system includes:

determining at least one of a coma, an astigmatism, and/or a tilt of the optical projection system based on the spatial focus map of the photolithography exposure.

\* \* \* \* \*